(12) United States Patent
Yu

(10) Patent No.: US 11,217,648 B2
(45) Date of Patent: Jan. 4, 2022

(54) OLED DISPLAY AND RELATED FORMING METHOD

(71) Applicant: Shenzhen China Star Optoelectronics Semiconductor Display Technology Co., Ltd., Shenzhen (CN)

(72) Inventor: Mingjue Yu, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 183 days.

(21) Appl. No.: 16/627,394

(22) PCT Filed: Dec. 10, 2019

(86) PCT No.: PCT/CN2019/124398
§ 371 (c)(1),
(2) Date: Dec. 30, 2019

(87) PCT Pub. No.: WO2021/103139
PCT Pub. Date: Jun. 3, 2021

(65) Prior Publication Data
US 2021/0335958 A1   Oct. 28, 2021

(30) Foreign Application Priority Data
Nov. 25, 2019   (CN) .......................... 201911164985.0

(51) Int. Cl.
*H01L 27/32*   (2006.01)
*H01L 27/12*   (2006.01)
*H01L 51/52*   (2006.01)
*H01L 51/56*   (2006.01)

(52) U.S. Cl.
CPC ...... *H01L 27/3265* (2013.01); *H01L 27/1288* (2013.01); *H01L 27/3258* (2013.01); *H01L 27/3272* (2013.01); *H01L 51/5215* (2013.01); *H01L 51/5234* (2013.01); *H01L 51/56* (2013.01); *H01L 2227/323* (2013.01)

(58) Field of Classification Search
None
See application file for complete search history.

(56) References Cited

U.S. PATENT DOCUMENTS

2016/0133681 A1*  5/2016  Nam ................... H01L 27/3265
                                                                257/40
2020/0144509 A1*  5/2020  Song ................... H01L 51/0061

* cited by examiner

*Primary Examiner* — Michelle Mandala

(57) ABSTRACT

An OLED display includes: a color resistor layer, a buffer layer covering the color resistor layer, a transistor having a transparent conductive layer, a gate metal layer, and an output electrode, a pixel electrode, and a storage capacitor having a first transparent electrode and a second transparent electrode. The pixel electrode is the second transparent electrode, a projected area of the first transparent electrode on the substrate is larger than or equal to a projected area of the color resistor layer on the substrate. The upper electrode and lower electrode of the storage capacitor are replaced with a transparent material to raise the aperture rate. The gate insulating layer is used in the capacitor area to increase the capacitance. The storage capacitor adopts the transparent electrodes to solve the issues of low capacitance of the storage capacitor and the unstable components caused by the reflected light.

8 Claims, 9 Drawing Sheets

OLED DISPLAY AND RELATED FORMING METHOD

RELATED APPLICATIONS

This application is a National Phase of PCT Patent Application No. PCT/CN2019/124398 having International filing date of Dec. 10, 2019, which claims the benefit of priority of Chinese Patent Application No. 201911164985.0 filed on Nov. 25, 2019. The contents of the above applications are all incorporated by reference as if fully set forth herein in their entirety.

FIELD AND BACKGROUND OF THE INVENTION

The present invention relates to a display technique, and more particularly, to an OLED display and related forming method.

In the driving circuit of a normal active matrix organic light emitting diode (AMOLED) display, the upper electrode and the lower electrode of the storage capacitor are both made by a metal. Therefore, the storage capacitor is not transparent and thus the lighting area of the pixel is reduced. A solution is to form a metal/transparent conducting layer structure below the driving transistor area to block lights. Further, the transparent conducting layer is formed as the upper electrode and the lower electrode of the storage capacitor area. This could raise the aperture rate. However, the capacitance of the storage capacitor may be too low due to a thick buffer layer. In addition, the light blocking layer may not only block light but also reflect some light to other components of the display and thus ruins the performance of the display.

SUMMARY OF THE INVENTION

One objective of an embodiment of the present invention is to provide an OLED display and related forming method to solve the above-mentioned issues.

According to an embodiment of the present invention, an organic light emitting diode (OLED) display is disclosed. The OLED display comprises: a substrate; a color resistor layer, positioned on the substrate; a buffer layer, positioned on the substrate and covering the color resistor layer; a transistor, comprising a gate and an output electrode, the gate comprises a transparent conductive layer and a gate metal layer; a pixel electrode, electrically connected to the output electrode; and a storage capacitor, comprising a first transparent electrode and a second transparent electrode; wherein the pixel electrode is the second transparent electrode, a projected area of the first transparent electrode on the substrate is larger than or equal to a projected area of the color resistor layer on the substrate.

Optionally, the OLED display further comprises a light blocking layer positioned on the substrate. The buffer layer covers the light blocking layer.

Optionally, the storage capacitor comprises a shielding layer positioned on the buffer layer, and an insulating layer positioned between the first transparent electrode and the shielding layer.

Optionally, the transistor comprises an active layer positioned on the buffer layer, and a gate insulating layer positioned on the active layer. The active layer and the shielding layer are manufactured with an amorphous oxide semiconductor.

Optionally, the transparent conducting layer, the first transparent electrode and the second transparent electrode are manufactured with Indium Tin Oxide (ITO), Indium Zinc Oxide (IZO) or a combination of ITO and IZO.

According to an embodiment of the present invention, a method for forming an OLED display is disclosed. The method comprises: forming a color resistor layer on a substrate; forming a buffer layer on the substrate, wherein the buffer layer covers the color resistor layer; sequentially forming a transparent conducting material and a metal layer on the buffer layer, performing a photolithography operation on the transparent conducting material and the metal layer to form a gate of the transistor and a first transparent of a storage capacitor; and forming a second transparent conducting layer on the transistor as a second transparent electrode of the storage capacitor and a pixel electrode; wherein the gate of the transistor comprises a transparent conducting layer and a gate metal layer, and a projected area of the first transparent electrode on the substrate is larger than or equal to a projected area of the color resistor layer on the substrate.

Optionally, the method further comprises forming a light blocking layer on the substrate before the step of forming the buffer layer.

Optionally, the step of forming the gate of the transistor and the first transparent electrode of the storage capacitor comprises utilizing a halftone mask to perform a photolithography operation on the transparent conducting material and the metal layer to form the gate of the transistor and the first transparent of the storage capacitor.

Optionally, the method further comprises: depositing an amorphous oxide semiconductor on the buffer layer; performing a photolithography operation on the amorphous oxide semiconductor to form an active layer of the transistor and a shielding layer of the storage capacitor; sequentially depositing an insulating material, the transparent conducting material and the metal layer on the active layer and the shielding layer of the storage capacitor; utilizing a halftone mask to pattern a photo resistor on the metal layer; etching the transparent conducting material and the metal layer to form the gate of the transistor and the first transparent electrode of the storage capacitor; and etching the insulating material to form a gate insulating layer of the transistor and an insulating layer of the storage capacitor.

Optionally, the method further comprises: depositing an interlayer insulating layer on the gate and the first transparent electrode; performing a photolithography operation on the interlayer insulating layer to form a first via; forming an output electrode of the transistor such that the output electrode is connected to the active layer through the first via; forming a planarization layer on the interlayer insulating layer; performing a photolithography operation on the planarization layer to form a second via; and forming the pixel electrode such that the pixel electrode is connected to the output electrode through the second via.

In contrast to the conventional art, the OLED display of an embodiment of the present invention utilizes a transparent material to form the upper electrode and the lower electrode of the storage capacitor. This solves the issue of low capacitance of the storage capacitor and also prevent from unstable condition of the components caused by the reflected light.

These and other features, aspects and advantages of the present disclosure will become understood with reference to the following description, appended claims and accompanying figures.

BRIEF DESCRIPTION OF THE SEVERAL VIEWS OF THE DRAWINGS

To describe the technical solutions in the embodiments of this application more clearly, the following briefly introduces the accompanying drawings required for describing the embodiments. Apparently, the accompanying drawings in the following description show merely some embodiments of this application, and a person of ordinary skill in the art may still derive other drawings from these accompanying drawings without creative efforts.

DESCRIPTION OF SPECIFIC EMBODIMENTS OF THE INVENTION

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented and the spatially relative descriptors used herein interpreted accordingly.

Figure 1:
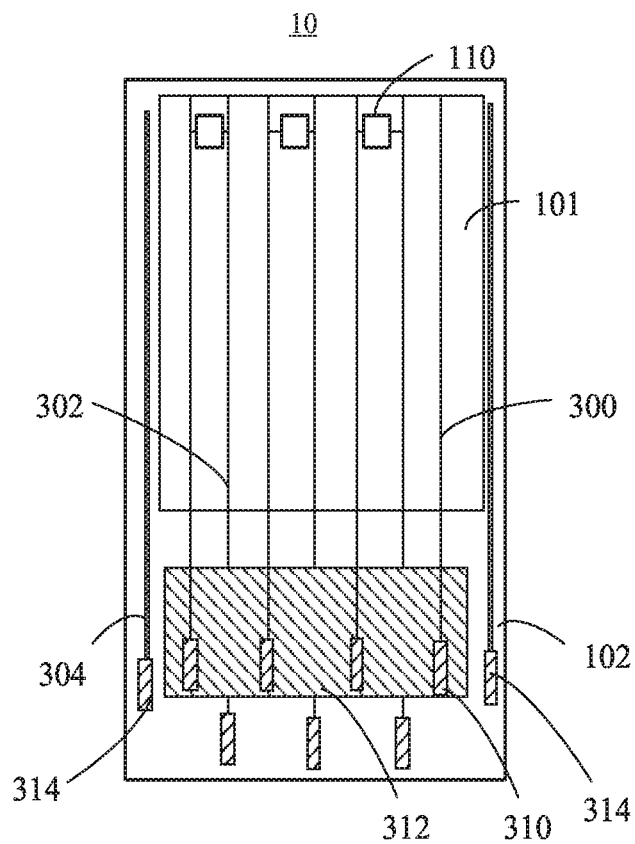
FIG. 1 is a diagram of an OLED display according to an embodiment of the present invention.
Figure 2:
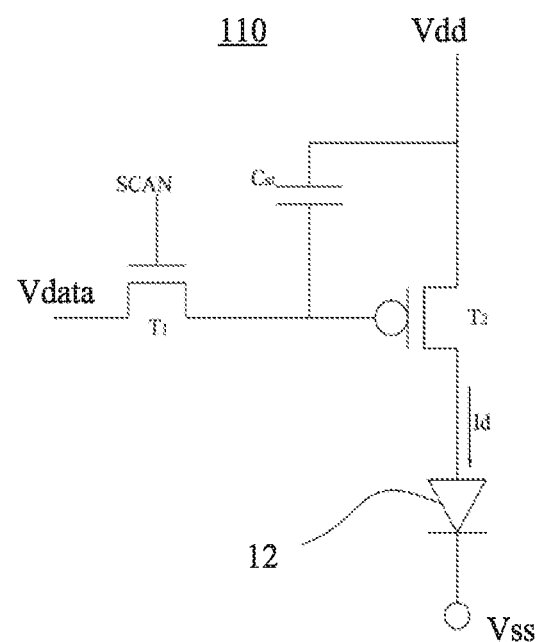
FIG. 2 is a diagram of the pixel circuit in the active area shown in FIG. 1.

Please refer to FIG. 1 and FIG. 2. FIG. 1 is a diagram of an OLED display 10 according to an embodiment of the present invention. FIG. 2 is a diagram of the pixel circuit 110 in the active area 101 shown in FIG. 1. The flexible OLED display 10 comprises an active area 101 and an inactive area 102.

The inactive area 102 has multiple data voltage wires 300, multiple driving voltage wires 302 and 304, multiple data transmission pads 310, and multiple driving transmission pads 312 and 314. The multiple data voltage wires 300 are one-to-one connected to the multiple data transmission pads 310. The multiple driving voltages wires 302 and 304 are one-to-one connected to the multiple driving transmission pads 312 and 314. The active region 101 has multiple pixel circuits 110. Each pixel circuit 110 is connected to the corresponding driving voltage wires 302 and 304 and the data voltage wire 300. The data transmission pad 310 is used to receive the data voltage Vdata transmitted from the image processor (not shown) and transfers the data voltage Vdata to the corresponding pixel circuit 110 through the data voltage wire 300. The driving transmission pads 312 and 314 are respectively used to transfer high/low driving voltages Vdd/Vss to the corresponding pixel circuit 110 through the driving voltage wires 302 and 304.

The pixel circuit 110 comprises a switch transistor T1, a driving transistor T2, a storage capacitor Cst and an OLED 12. When the scan signal voltage is transferred from the scanning end SCAN and turns on the switch transistor T1, the data voltage Vdata is transferred from the data end DATA to the gate of the driving transistor T2 through the switch transistor T1. When the driving transistor T2 operates in the saturation region, the conducting current Id of the driving transistor T2 is determined by the gate voltage and the source voltage (Vsg=Vdd−Vdata). That is, $Id=K(Vsg-Vt)^2=K(Vdd-Vdata-Vt)^2$. Because the luminance of the OLED 12 is proportional to the conducting current Id, the OLED 12 adjusts its luminance according to the data voltage Vdata to make the corresponding pixel have different grey values. In addition, because the data voltage Vdata is stored in the storage capacitor Cst, the luminance of the OLED 12 could be maintained in the transition of images.

Figure 3:
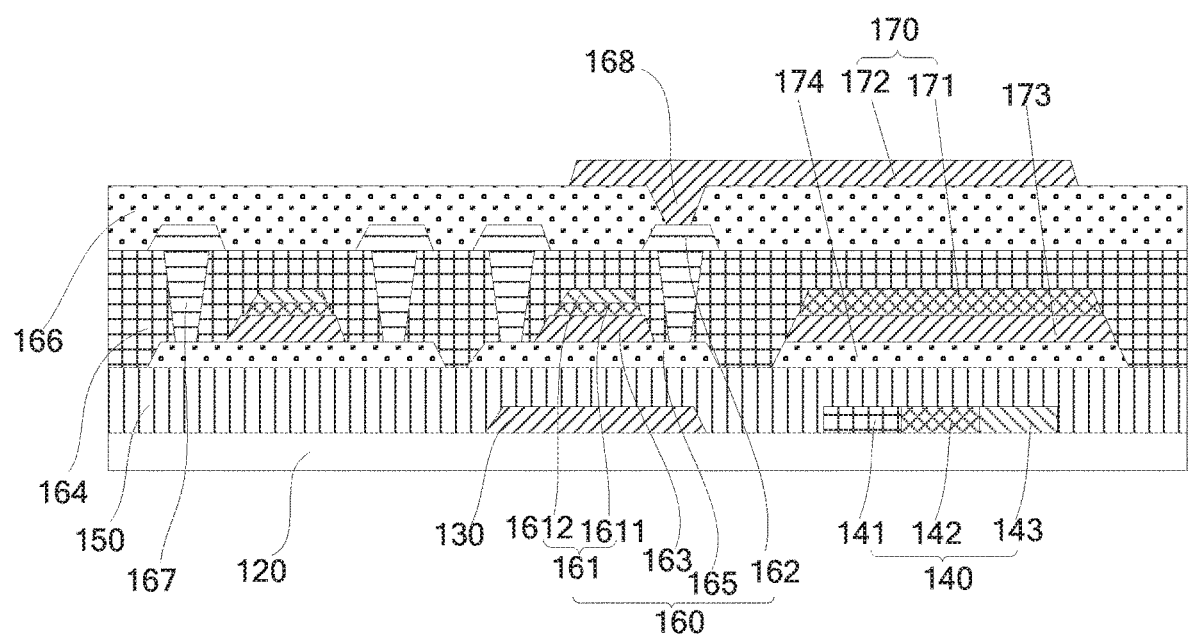
FIG. 3 is a diagram of the structure of an OLED display according to an embodiment of the present invention.

Please refer to FIG. 3. FIG. 3 is a diagram of the structure of the OLED display 10 according to an embodiment of the present invention. The OLED display 10 comprises a substrate 120, a light blocking layer 130, a color resistor layer 140, a buffer layer 150, a transistor 160, an interlayer metal layer 164, a protection layer 166, a storage capacitor 170, an insulating layer 173, a shielding layer 174, a pixel electrode and a planarization layer 180. The storage capacitor 170 comprises a first transparent electrode 171 and a second transparent electrode 172. The pixel electrode is the second transparent electrode 172.

The light blocking layer 130 is positioned on the substrate 120. The light blocking layer 130 is the black photo resistor, which replaces a metal to prevent from reflecting lights. This reduces the parasitic capacitor coupling effect caused by the light blocking metal. The color resistor layer 140 is positioned on the substrate 120. The color resistor layer 140 comprises a red color resistor 141, a green color resistor 142 and a blue color resistor 143. The color resistor 140 is formed on the storage capacitor area of the substrate 120.

The buffer layer 150 is positioned on the substrate 120 and covers the light blocking layer 130 and the color resistor layer 140. The buffer layer 150 is used as a blocking layer to block humidity or impurities such that the humidity and impurities cannot diffuse through the substrate 120, the light blocking layer 130 and the color resistor layer 140. In addition, the buffer layer 150 could be used as a planarization layer of the color resistor layer 140 such that a further planarization process could be eliminated to reduce the cost. The buffer layer 150 is a film, which could be manufactured with an inorganic material, such as silicon oxide (SiOx), silicon nitride (SiNx), silicon oxynitride (SiOxNy), aluminum oxide (AlOx), aluminum nitride (AlNx) or etc.

The transistor 160 could be a transistor T2 shown in FIG. 2. The transistor 150 is positioned on the buffer layer 150. The transistor 160 comprises a gate 161 and an output electrode 162. The gate 161 comprises a transparent conducting layer 1611 and a gate metal layer 1612. The transistor 160 further comprises an active layer 165 and a gate insulating layer 163. The active layer 165 is positioned on the buffer layer 150. The gate insulating layer 163 is positioned on the active layer 165. The active layer 165 could be formed by crystallizing an amorphous silicon into a poly-silicon or could be formed by an amorphous oxide semiconductor. The gate insulating layer 163 is positioned on the active layer 165. The gate insulating layer 163 could be manufactured with an inorganic material, such as silicon oxide (SiOx), silicon nitride (SiNx), or metal oxide. The gate insulating layer 163 could be a single layer or multiple layers. The transparent conducting layer 1611 is positioned on the gate insulating layer 163. The transparent conducting layer 1611 could be manufactured with oxide, such as ITO or IZO and could be a single layer or multiple layers. The gate metal layer 1612 and the transparent conducting layer 1611 constitute the gate of the driving transistor T2 (the control end of the driving transistor T2). The gate metal layer 1612 could comprise a single layer structure or multi-layer structure comprising at least one of copper (Cu), molybdenum (Mo), nickel (Ni), platinum (Pt), aluminum (Al), and chromium (Cr). The interlayer insulating layer 164 is positioned on the gate metal layer 1612 and could be manufactured with an insulating inorganic material such as silicon oxide or silicon nitride. The output electrode 162 of the driving transistor T2 is electrically connected to the active layer 165 through the first via 167. The via 167 extends vertically to the active layer 165. The first via 167 is covered and filled by the source/drain metal layer (the output electrode 162). The protection layer 166 is positioned on the source/drain metal layer. The protection 166 could be manufactured by an organic material, such as acrylic, PI or BCB. The second via 168 is positioned in the protection layer 166. The second via 168 extends vertically to the output electrode 162.

The storage capacitor 170 comprises the first transparent electrode 171 and the second transparent electrode 172. The shielding layer 174 is positioned on the buffer layer 150. The insulating layer 173 is positioned between the first transparent electrode 171 and the shielding layer 174. The active layer 165 and the shielding layer 174 are manufactured with amorphous oxide semiconductor. The transparent conducting layer 1611, the first transparent electrode 171 and the second transparent electrode 172 could be manufactured with ITO, IZO or their combination. The projected area of the first transparent electrode 171 on the substrate 120 is larger than or equal to the projected area of the color resistor layer 140 on the substrate.

The second transparent electrode 172 is connected to the output electrode 162. The second transparent electrode 172 is used as the pixel electrode. The planarization layer 180 could be manufactured with an organic material, such as PI, Polyamide BCB, acrylic resin or phenol formaldehyde resin.

Figure 4:
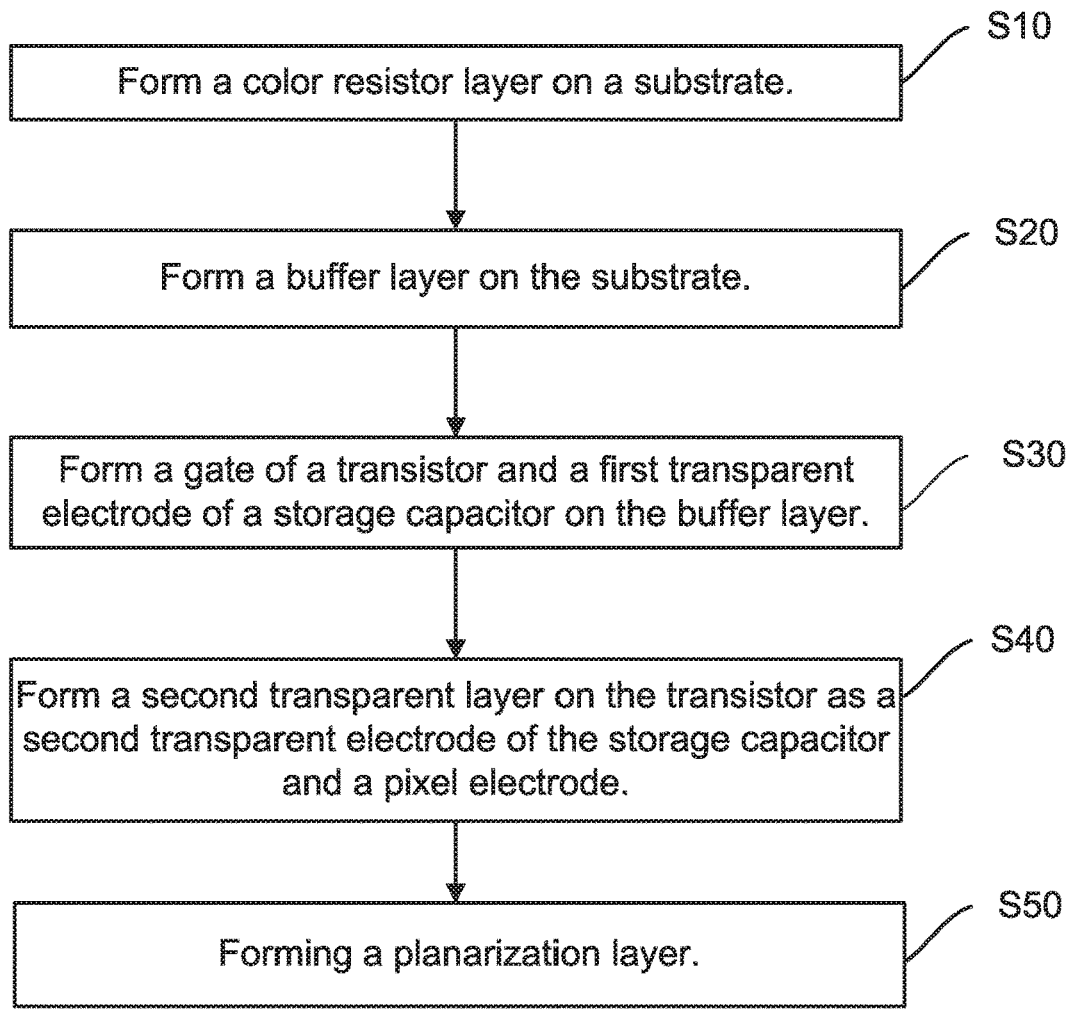
FIG. 4 is a flow chart of forming an OLED display according to an embodiment of the present invention.

Please refer to FIG. 4. FIG. 4 is a flow chart of forming an OLED display according to an embodiment of the present invention. The flow chart comprises following steps:

S10: forming a color resistor layer 140 on the substrate 120.

S20: forming a buffer layer on the substrate 120. The buffer layer 150 covers the color resistor layer 140.

S30: forming the gate 161 of the transistor 160 and the first transparent electrode 171 of the storage capacitor on the buffer layer 150.

S40: forming the second transparent layer on the transistor 160 as the second transparent electrode 172 of the storage capacitor and the pixel electrode.

S50: forming a planarization layer 180.

Figure 5:
FIG. 5, FIG. 6, FIG. 7, FIG. 8, FIG. 9, FIG. 10, FIG. 11, FIG. 12, FIG. 13, FIG. 14, FIG. 15, FIG. 16, and FIG. 17 are diagrams of the forming method of the OLED display according to an embodiment of the present invention.
Figure 6:
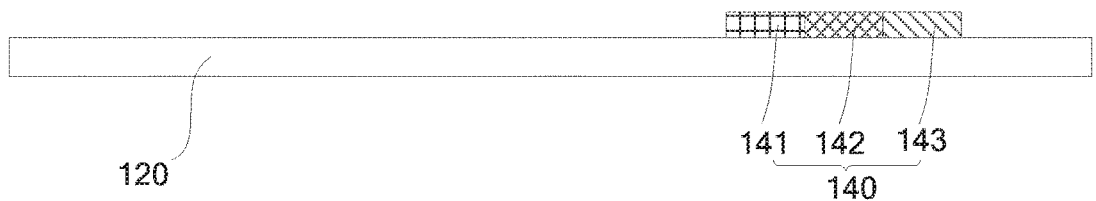
Figure 7:
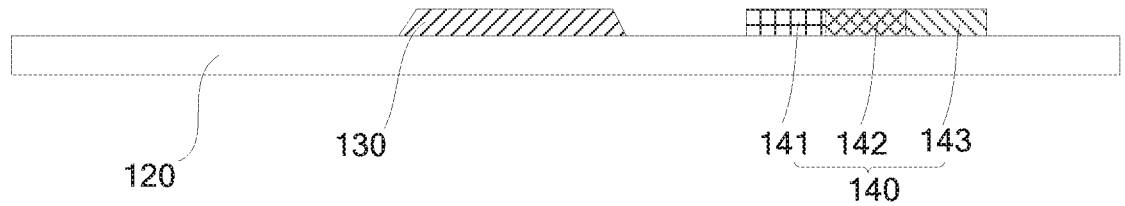

Please refer to FIG. 5 and FIG. 6. In the step S10, the color resistor layer 140 is formed on the substrate 120. The color resistor layer 140 comprises a red color resistor 141, a green color resistor 142 and a blue color resistor 143. The color resistor layer 140 is deposited on the storage capacitor area 40 of the substrate 120. Please refer to FIG. 7. A light blocking layer 130 is deposited on the substrate. A photolithography process is performed on the light blocking layer 130 to form a pattern. The light blocking layer 130 could be formed before the formation of the color resistor layer 140. The light blocking layer 130 is a black color resistor, which replace a light blocking metal, for avoiding reflection of inner light. This reduces the parasitic capacitor coupling effect caused by the light blocking metal.

Figure 8:
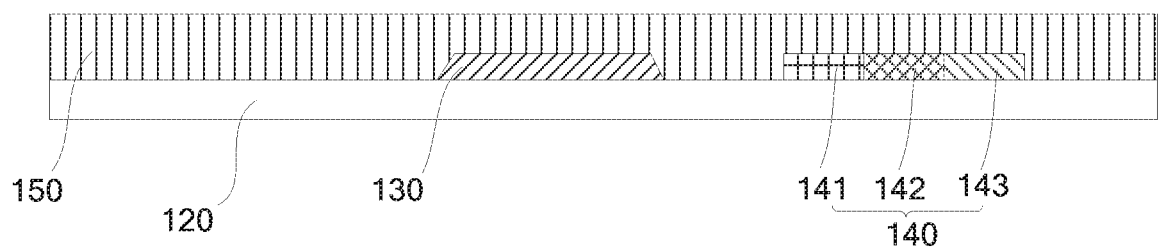

Please refer to FIG. 8. In step S20, the buffer layer 150 is formed on the substrate 120. The buffer layer 150 is used as a blocking layer to block humidity or impurities such that the humidity and impurities cannot diffuse through the substrate 120, the light blocking layer 130 and the color resistor layer 140. In addition, the buffer layer 150 could be used as a planarization layer of the color resistor layer 140 such that a further planarization process could be eliminated to reduce the cost. The buffer layer 150 is a film, which could be manufactured with an inorganic material, such as silicon oxide (SiOx), silicon nitride (SiNx), silicon oxynitride (SiOxNy), aluminum oxide (AlOx), aluminum nitride (AlNx) or etc.

Figure 9:
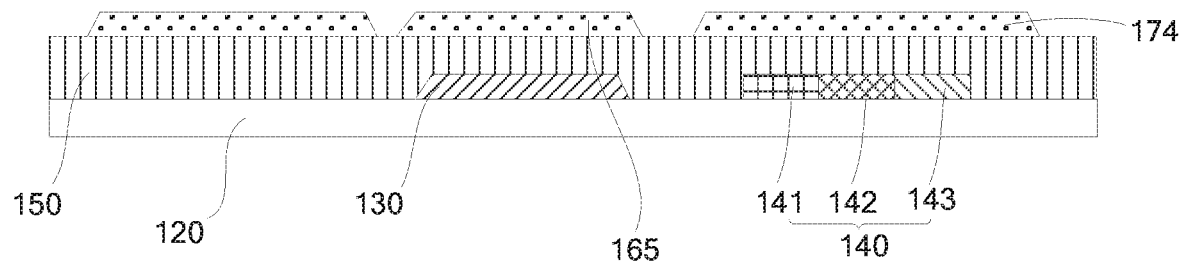

Please refer to FIG. 9. The amorphous oxide semiconductor material is deposited on the buffer layer 150 and a photolithography process is performed on the amorphous oxide semiconductor material to form the active layer 165 of the transistor 165 and the shielding layer 174 of the storage capacitor Cst. The active layer 165 and the shielding layer 174 could be formed by crystallizing an amorphous silicon into a poly-silicon. Specifically, in order to crystallize the amorphous silicon, an RTA process, an ELA process, an SPC process, and an MIC process, an MILC process or an SLS process could be used.

Figure 10:
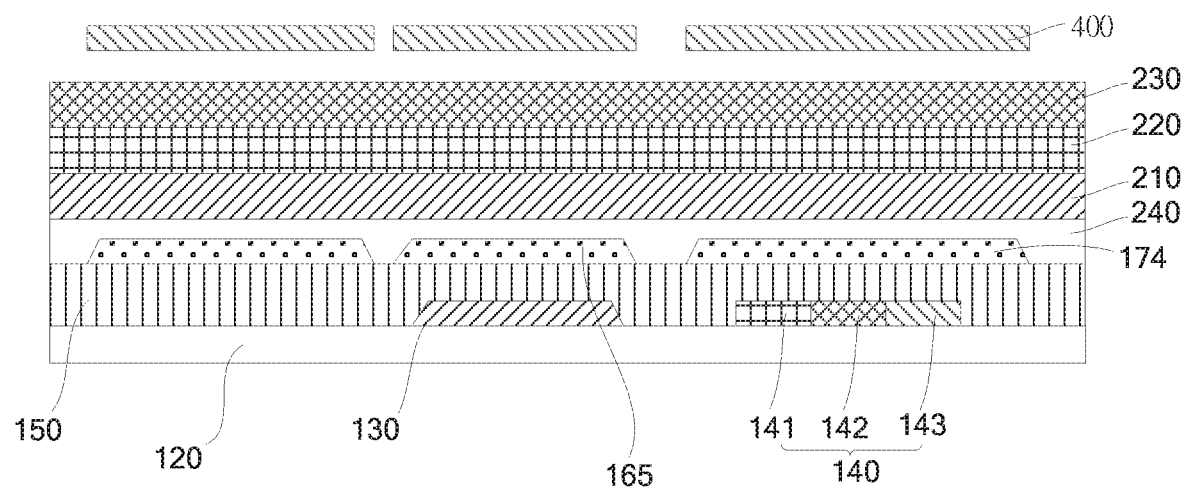

Please refer to FIG. 10. The insulating material 240, the transparent conducting material 210 and the metal layer 220 are sequentially deposited on the active layer 165 and the shielding layer 174. The insulating material 240 could be manufactured with an inorganic material, such as silicon oxide, silicon nitride or metal oxide, and could be a single layer or multiple layers. The transparent material 210 could be manufactured by oxide such as ITO or IZO and could be a single layer or multiple layers. The metal layer 220 could be a single layer or multiple layers comprising at least one of copper (Cu), molybdenum (Mo), nickel (Ni), platinum (Pt), aluminum (Al), and chromium (Cr). Then, the color resistor 230 is spread on the metal layer 220 and a halftone mask 400 is used to perform a photolithography process on the color resistor 320 to define the areas of the gate 161 of the transistor 161 and the first transparent electrode 171 of the storage capacitor. At this time, the color resistor 230 corresponding to the control end (the gate metal layer 1612 show in FIG. 12) of the driving transistor T2 is comparatively thicker. In contrast, the color resistor 230 corresponding to the storage capacitor is comparatively thinner.

Figure 11:
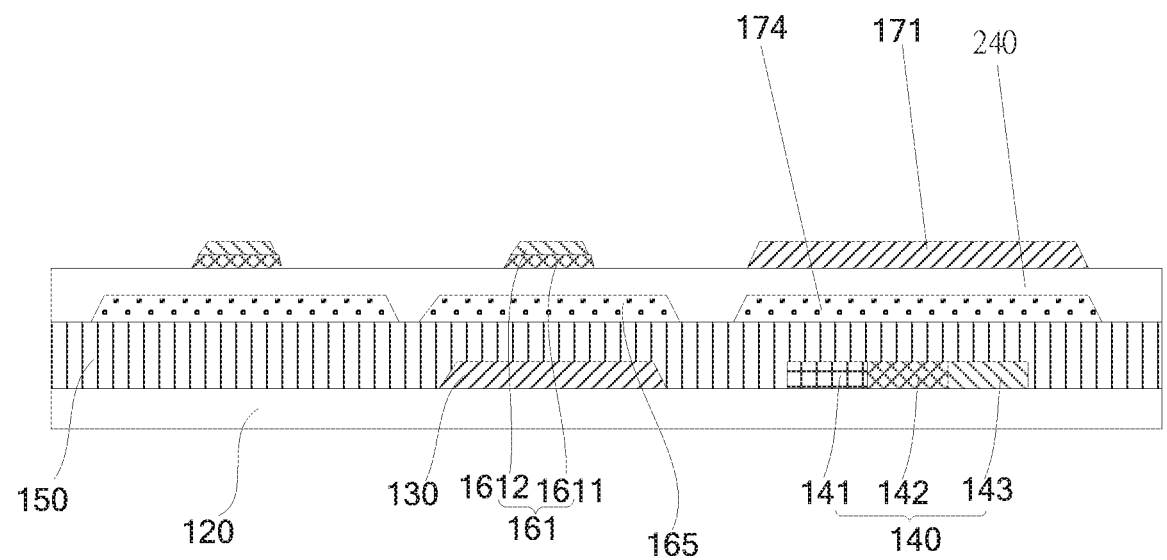

Please refer to FIG. 11. A wet etching process is performed on the transparent conducting material 210 and the metal layer 220 to form the gate 161 of the transistor 160 and the first transparent electrode 171 of the storage capacitor. The gate 161 comprises the transparent conducting layer 1611 and the gate metal layer 1612.

Figure 12:
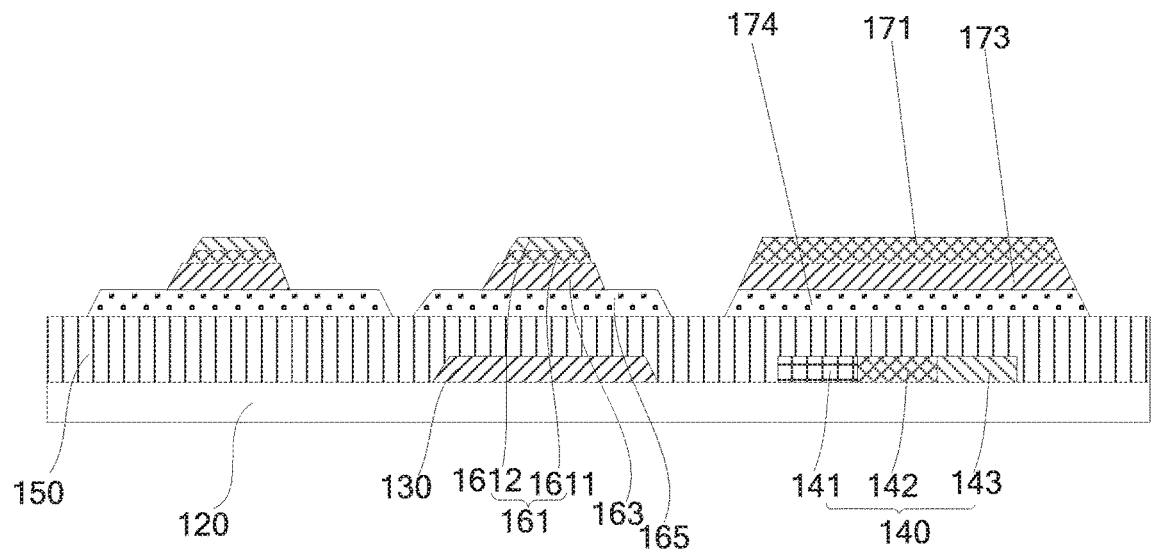

Please refer to FIG. 12. A dry etching process is performed on the insulating material 240 to form the gate insulating layer 163 of the transistor 160 and the insulating layer 173 of the storage capacitor. Then, the color resistor 230 is removed. At this time, the projected area of the first transparent electrode 171 on the substrate 120 is larger than or equal to the projected area of the color resistor layer 140 on the substrate. The gate metal layer 1612 (the control end of the driving transistor T2) is positioned on the transparent conducting layer 1611.

Figure 13:
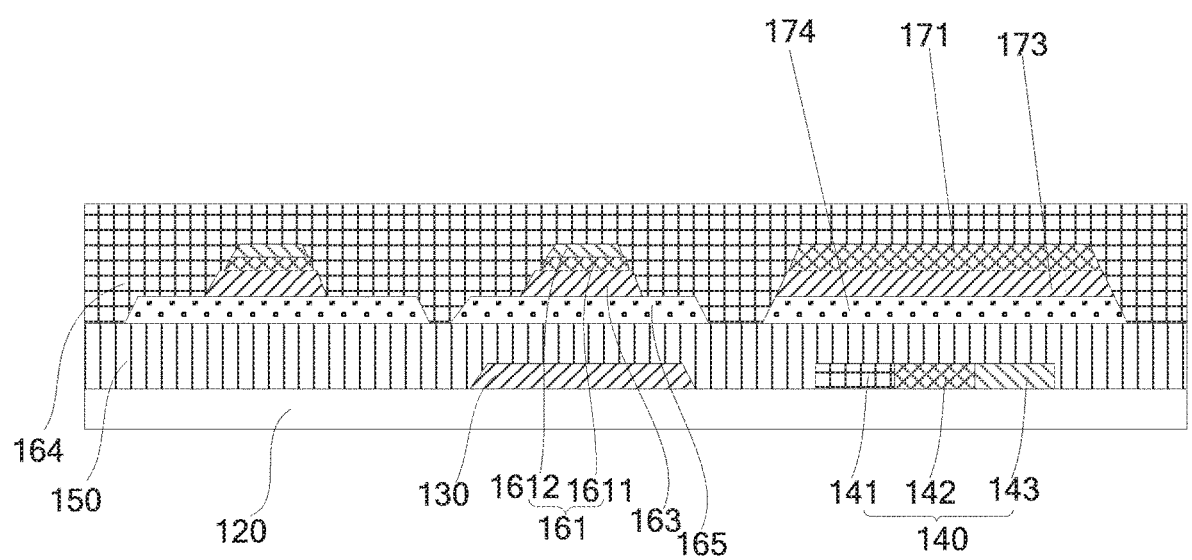

Please refer to FIG. 13. The interlayer insulating layer 164 is deposited on the gate 161 and the first transparent electrode 171. The interlayer insulating layer 164 is positioned on the gate metal layer 1612 and could be manufactured with an inorganic material, such as silicon oxide or silicon nitride.

Figure 14:
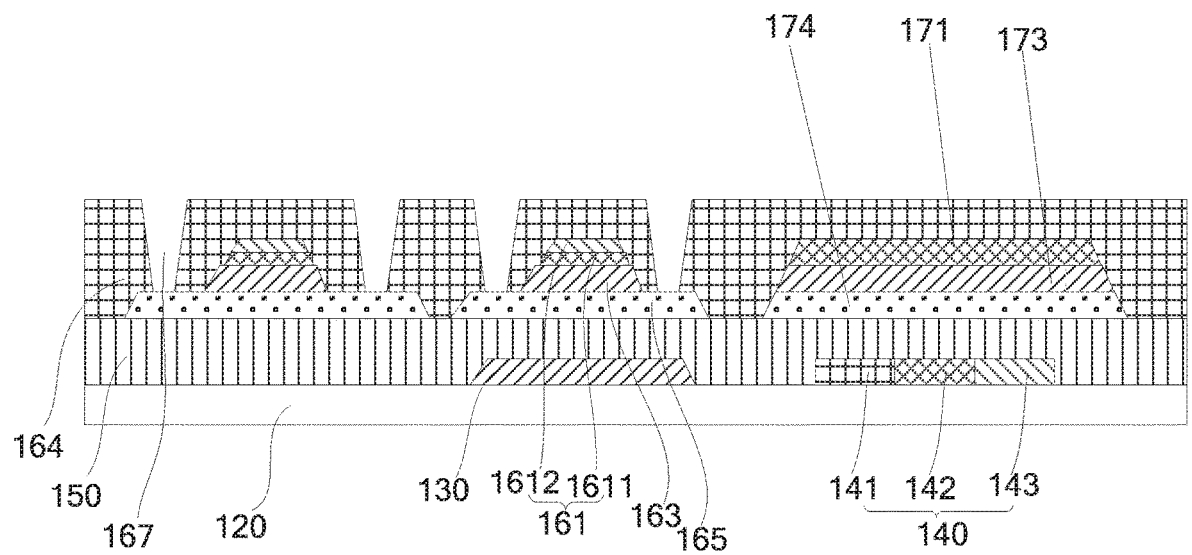
Figure 15:
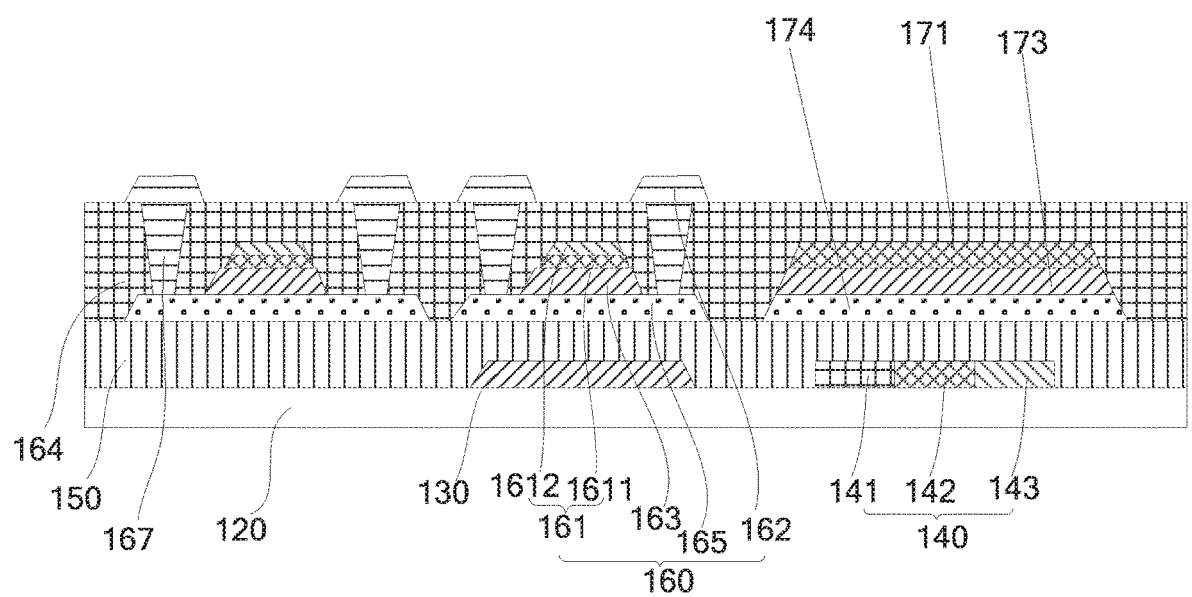

Please refer to FIG. 14 and FIG. 15. A photolithography process is performed on the interlayer insulating layer 164 to form the first via 167. The first via 167 extends vertically to the active layer 165. Then, the metal layer is deposited on the interlayer insulating layer 164 and the metal layer is patterned to form the output electrode 162 of the transistor. In this way, the output electrode 162 is connected to the active layer 165 through the first via. The output electrode 162 could be the source or the drain of the transistor T1 or the transistor T2. The output electrode 162 of the switch transistor T1 and the driving transistor T2 are connected to the active layer 162 through the first via 167.

Figure 16:
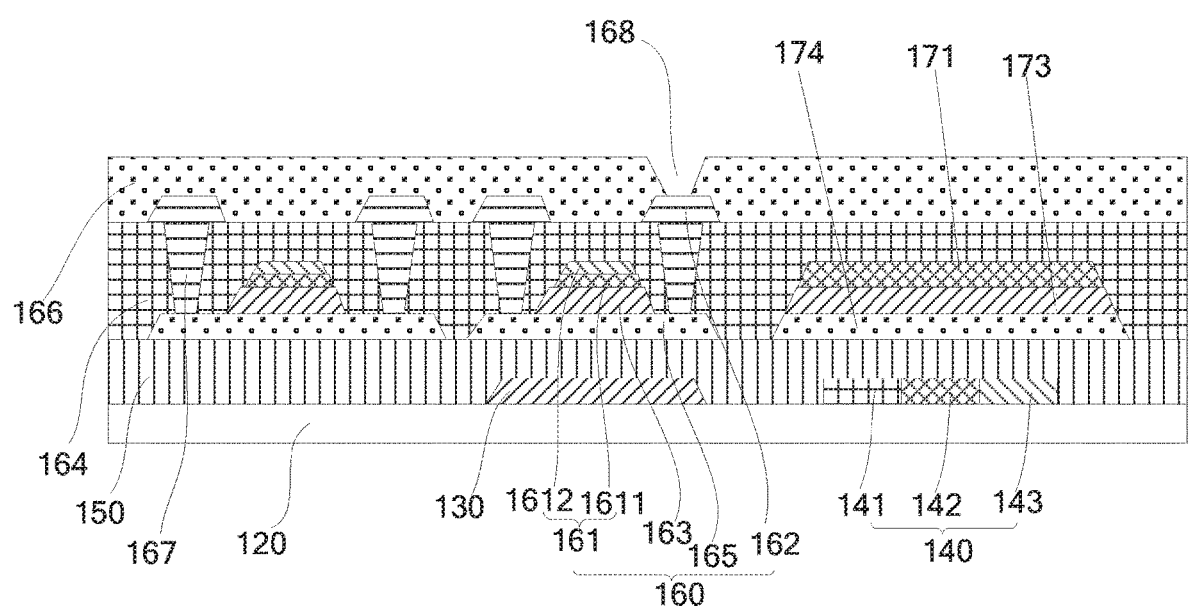

Please refer to FIG. 16. The protection layer 166 is formed on the interlayer insulating layer 164. A photolithography process is performed on the protection layer 166 to form the second via 168. The second via 168 extends vertically to the output electrode 162.

Figure 17:
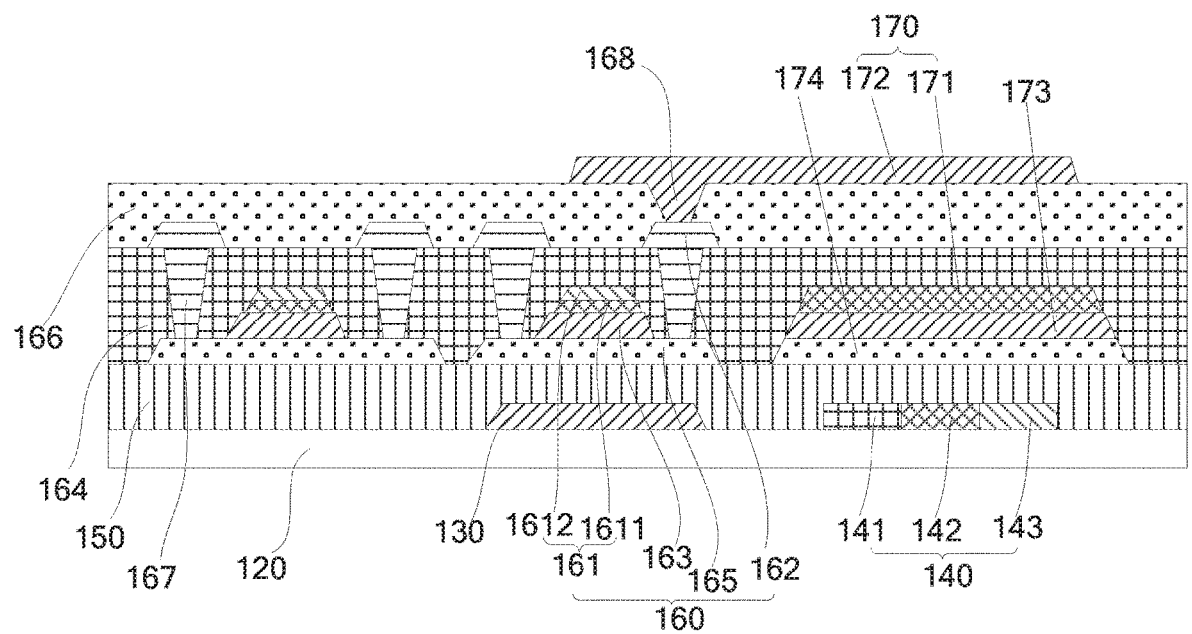

Please refer to FIG. 17. The second transparent conducting layer is formed on the transistor 160 as the second transparent electrode 172, which is the pixel electrode as well.

In the step S50, the planarization layer 180 is formed.

From the above, an embodiment of the present invention utilizes the light blocking layer to replace the light blocking metal. This could avoid the reflection of inner light. The color resistor layer is formed at the same time when the process of forming the light blocking layer. Further, the buffer layer could be used as a planarization layer to reduce the cost. In addition, the upper electrode and the lower electrode of the storage capacitor are replaced with a transparent material to raise the aperture rate. The gate insulating layer is used in the capacitor area to increase the capacitance. The storage capacitor adopts the transparent electrodes to solve the issues of low capacitance of the storage capacitor and the unstable components caused by the reflected light.

While the embodiments of the present disclosure have been shown and described above, it is to be understood that the above embodiments are exemplary and are not to be construed as limiting the present disclosure. One of ordinary skill in the art may make variations, modifications, substitutions and alterations to the above embodiments within the scope of the present disclosure.

INDUSTRIAL APPLICABILITY

The subject matter of the present disclosure can be manufactured and used in an industry, thereby meeting industrial applicability.

What is claimed is:

1. An organic light emitting diode (OLED) display, comprising:
    a substrate;
    a color resistor layer, positioned on the substrate;
    a buffer layer, positioned on the substrate and covering the color resistor layer;
    a transistor, comprising:
        an output electrode;
        a transparent conductive layer;
        a gate metal layer;
        an active layer, positioned on the buffer layer; and
        a gate insulating layer, positioned on the active layer;
    a pixel electrode, electrically connected to the output electrode; and
    a storage capacitor, comprising:
        a first transparent electrode;
        a second transparent electrode;
        a shielding layer, positioned on the buffer layer; and
        an insulating layer, positioned between the first transparent electrode and the shielding layer;
    wherein the pixel electrode is the second transparent electrode, a projected area of the first transparent electrode on the substrate is larger than or equal to a projected area of the color resistor layer on the substrate, and
    wherein the active layer and the shielding layer are manufactured with an amorphous oxide semiconductor.

2. The OLED display of claim 1, further comprising:
    a light blocking layer, positioned on the substrate;
    wherein the buffer layer covers the light blocking layer.

3. The OLED display of claim 1, wherein the transparent conducting layer, the first transparent electrode and the second transparent electrode are manufactured with Indium Tin Oxide (ITO), Indium Zinc Oxide (IZO) or a combination of ITO and IZO.

4. A method for forming an OLED display, the method comprising:
    forming a color resistor layer on a substrate;
    forming a buffer layer on the substrate, wherein the buffer layer covers the color resistor layer;
    sequentially forming a transparent conducting material and a metal layer on the buffer layer, performing a photolithography operation on the transparent conducting material and the metal layer to form a gate of the transistor and a first transparent of a storage capacitor; and
    forming a second transparent conducting layer on the transistor as a second transparent electrode of the storage capacitor and a pixel electrode;
    wherein the gate of the transistor comprises a transparent conducting layer and a gate metal layer, and a projected area of the first transparent electrode on the substrate is larger than or equal to a projected area of the color resistor layer on the substrate.

5. The method of claim 4, further comprising:
    forming a light blocking layer on the substrate before the step of forming the buffer layer.

6. The method of claim 4, wherein the step of forming the gate of the transistor and the first transparent electrode of the storage capacitor comprises:
    utilizing a halftone mask to perform a photolithography operation on the transparent conducting material and the metal layer to form the gate of the transistor and the first transparent of the storage capacitor.

7. The method of claim 4, further comprising:
    depositing an amorphous oxide semiconductor on the buffer layer;
    performing a photolithography operation on the amorphous oxide semiconductor to form an active layer of the transistor and a shielding layer of the storage capacitor;
    sequentially depositing an insulating material, the transparent conducting material and the metal layer on the active layer and the shielding layer of the storage capacitor;
    utilizing a halftone mask to pattern a photo resistor on the metal layer;
    etching the transparent conducting material and the metal layer to form the gate of the transistor and the first transparent electrode of the storage capacitor; and
    etching the insulating material to form a gate insulating layer of the transistor and an insulating layer of the storage capacitor.

8. The method of claim 7, further comprising:
    depositing an interlayer insulating layer on the gate and the first transparent electrode;
    performing a photolithography operation on the interlayer insulating layer to form a first via;

forming an output electrode of the transistor such that the output electrode is connected to the active layer through the first via;

forming a planarization layer on the interlayer insulating layer;

performing a photolithography operation on the planarization layer to form a second via; and forming the pixel electrode such that the pixel electrode is connected to the output electrode through the second via.

\* \* \* \* \*